(12) United States Patent
Song

(10) Patent No.: US 12,355,160 B2
(45) Date of Patent: Jul. 8, 2025

(54) DISPLAY DEVICE

(71) Applicant: LG ELECTRONICS INC., Seoul (KR)

(72) Inventor: Moonsoo Song, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/835,884

(22) PCT Filed: Jan. 27, 2023

(86) PCT No.: PCT/KR2023/001310
§ 371 (c)(1),
(2) Date: Aug. 5, 2024

(87) PCT Pub. No.: WO2023/243799
PCT Pub. Date: Dec. 21, 2023

(65) Prior Publication Data
US 2025/0149805 A1 May 8, 2025

(30) Foreign Application Priority Data

Jun. 17, 2022 (KR) .................. 10-2022-0074031
Jun. 17, 2022 (KR) .................. 10-2022-0074032

(51) Int. Cl.
*H01Q 21/28* (2006.01)
*H01Q 1/02* (2006.01)
(Continued)

(52) U.S. Cl.
CPC ............... *H01Q 21/28* (2013.01); *H01Q 1/02* (2013.01); *H01Q 1/526* (2013.01); *H04N 5/64* (2013.01);
(Continued)

(58) Field of Classification Search
CPC .......... H01Q 21/28; H01Q 1/02; H01Q 1/526; H05K 7/20954
See application file for complete search history.

(56) References Cited

U.S. PATENT DOCUMENTS

2014/0097997 A1* 4/2014 Chang ................ H01Q 9/42
343/846
2015/0116507 A1 4/2015 Sagerian et al.
(Continued)

FOREIGN PATENT DOCUMENTS

JP 2019-003014 1/2019
KR 10-2012-0020981 3/2012
(Continued)

OTHER PUBLICATIONS

Korean Intellectual Property Office Application No. 10-2024-7017140, Office Action dated Oct. 21, 2024, 7 pages.
(Continued)

*Primary Examiner* — Dieu Hien T Duong
(74) *Attorney, Agent, or Firm* — LEE, HONG, DEGERMAN, KANG & WAIMEY

(57) ABSTRACT

A display device is disclosed. The display device comprises: a display panel; a frame positioned behind the display panel and coupled to the display panel; and a communication box which is adjacent to one side of the frame, and which is coupled to the frame, wherein the communication box can comprise: an inner plate elongated in the vertical direction of the display panel; and an antenna module which has a plane formed in the direction crossing the vertical direction of the display panel, and which is fixed to the inner plate.

13 Claims, 15 Drawing Sheets

(51) Int. Cl.
  *H01Q 1/52*  (2006.01)
  *H01Q 21/24*  (2006.01)
  *H04N 5/64*  (2006.01)
  *H05K 7/20*  (2006.01)
  *H01Q 9/04*  (2006.01)
  *H01Q 9/16*  (2006.01)

(52) U.S. Cl.
  CPC ....... *H05K 7/20954* (2013.01); *H01Q 9/0407* (2013.01); *H01Q 9/16* (2013.01); *H01Q 21/24* (2013.01)

(56) References Cited

U.S. PATENT DOCUMENTS

2021/0050653 A1* 2/2021 Lee .................. G06F 1/1633
2021/0120203 A1* 4/2021 Kim .................. H04N 5/655

FOREIGN PATENT DOCUMENTS

| KR | 10-2018-0025669 | 3/2018 |
| KR | 1020190113287 | 10/2019 |
| KR | 1020210080049 | 6/2021 |
| KR | 1020210086313 | 7/2021 |
| KR | 1020210151603 | 12/2021 |
| WO | 2022-045405 | 3/2022 |

OTHER PUBLICATIONS

PCT International Application No. PCT/KR2023/001310, International Search Report dated May 12, 2023, 4 pages.

\* cited by examiner

DISPLAY DEVICE

CROSS-REFERENCE TO RELATED APPLICATION

This application is the National Stage filing under 35 U.S.C. 371 of International Application No. PCT/KR2023/001310, filed on Jan. 27, 2023, which claims the benefit of earlier filing date and right of priority to Korean Application Nos. 10-2022-0074031, filed on Jun. 17, 2022 and 10-2022-0074032, filed on Jun. 17, 2022, the contents of which are all incorporated by reference herein in their entirety.

TECHNICAL FIELD

The present disclosure relates to a display device.

BACKGROUND ART

As the information age progresses, demand for various kinds of display devices is increasing. In response to this demand, various kinds of display devices, such as LCDs (Liquid Crystal Displays), OLED (Organic Light-Emitting Diode) displays, and micro-LED displays, have been recently researched and used.

Thereamong, an LCD panel includes a TFT substrate and a color substrate, which face each other with a liquid crystal layer interposed therebetween, in order to display an image using light supplied from a backlight unit. Meanwhile, an OLED panel is configured to display an image by depositing a self-luminescent organic layer on a substrate having a transparent electrode formed thereon. Particularly, because a display device including an OLED panel do not need a backlight unit, there is an advantage of being capable of realizing an ultraslim display device.

A control box may be spaced apart from a display device, and may be used in the state of being close to a user. The control box may provide the display device with a variety of information. For example, the control box may be an AV box. The control box may transmit and receive information to and from a display head equipped with a display panel configured to display an image with or without wires.

In recent years, a great deal of research is being conducted on connectivity of such a display device.

DISCLOSURE

Technical Problem

It is an object of the present disclosure to solve the above and other problems.

It is another object of the present disclosure to provide a display device including a wireless communication module.

It is another object of the present disclosure to provide a structure capable of efficiently dissipating heat generated by a communication module.

It is still another object of the present disclosure to provide a display device capable of improving reception efficiency of an antenna of a communication module.

It is yet another object of the present disclosure to provide a structure capable of assuring rigidity of a communication module.

Technical Solution

In order to accomplish the above and other objects, a display device according to one aspect of the present disclosure may include a display panel, a frame positioned behind the display panel and coupled to the display panel, and a communication box disposed adjacent one side of the frame and coupled to the frame, wherein the communication box may include an inner plate which extends in a vertical direction of the display panel, and an antenna module which defines a flat surface in a direction which intersects the vertical direction of the display panel and is fixed to the inner plate.

Advantageous Effects

The effects of the display device according to the present disclosure will now be described.

According to at least one embodiment of the present disclosure, it is possible to provide a display device including a wireless communication module.

According to at least one embodiment of the present disclosure, it is possible to provide a structure capable of efficiently dissipating heat generated by a communication module.

According to at least one embodiment of the present disclosure, it is possible to provide a display device capable of improving reception efficiency of an antenna of a communication module.

According to at least one embodiment of the present disclosure, it is possible to provide a structure capable of assuring rigidity of a communication module.

The additional scope of applicability of the present disclosure will be apparent from the above detailed description. However, those skilled in the art will appreciate that various modifications and alterations are possible, without departing from the idea and scope of the present disclosure, and therefore it should be understood that the detailed description and specific embodiments, such as the preferred embodiments of the present disclosure, are provided only for illustration.

BEST MODE

A description will now be given in detail according to exemplary embodiments disclosed herein, with reference to the accompanying drawings. For the sake of brevity of description with reference to the drawings, the same or equivalent components are denoted by the same reference numbers, and a description thereof will not be repeated.

In general, suffixes such as "module" and "unit" may be used to refer to elements or components. The use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to facilitate understanding of various technical features, and it should be understood that the embodiments presented herein are not limited by the accompanying drawings. As such, the present disclosure should be construed to extend to any alterations, equivalents and substitutes, in addition to those that are particularly set out in the accompanying drawings.

It is to be understood that, although the terms "first," "second," etc. may be used herein to describe various elements, these elements should not be limited by these terms. These terms are only used to distinguish one element from another.

It will be understood that when an element is referred to as being "connected to" another element, intervening elements may be present. In contrast, it will be understood that when an element is referred to as being "directly connected to" another element, there are no intervening elements present.

A singular representation may include a plural representation unless the context clearly indicates otherwise.

In the present disclosure, it should be understood that the terms "comprises," "includes," "has," etc. specify the presence of features, numbers, steps, operations, elements, components, or combinations thereof described in the specification, but do not preclude the presence or addition of one or more other features, numbers, steps, operations, elements, components, or combinations thereof.

Indication of directions of upward U, downward D, leftward Le, rightward Ri, forward F, and rearward R is merely for convenience of description, and the technical idea disclosed in the present disclosure is not limited thereto.

Figure 1:
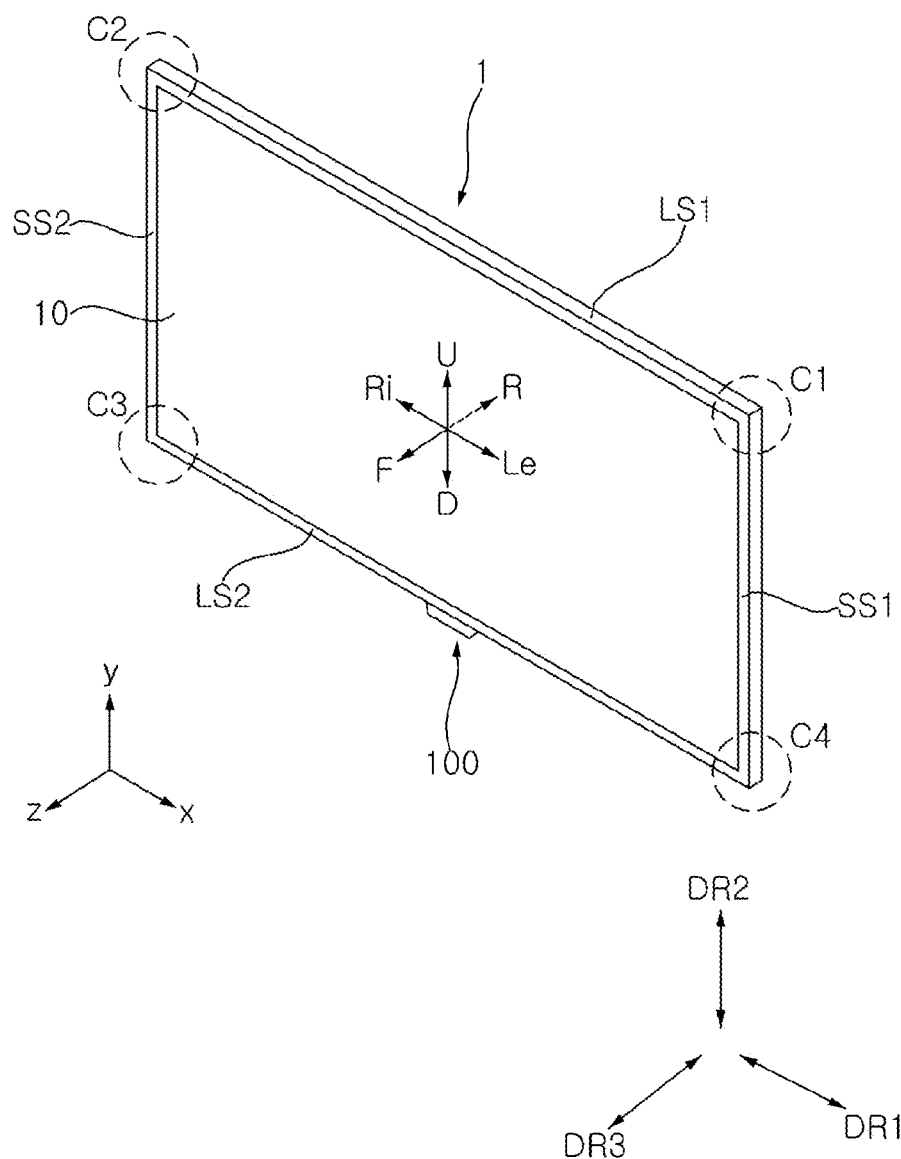
FIGS. 1 to 15 are views illustrating display devices according to embodiments of the present disclosure.

Referring to FIG. 1, a display device 1 may include a display panel 10. The display panel 10 may display a screen.

The display device 1 may include a first long side LS1, a second long side LS2 opposed to the first long side LS1, a first short side SS1 adjacent to the first long side LS1 and the second long side LS2, and a second short side SS2 opposed to the first short side SS1. Although each of the first and second long sides LS1 and LS2 is illustrated and described as being longer than each of the first and second short sides SS1 and SS2 for convenience of explanation, the length of each of the first and second long sides LS1 and LS2 may be almost equal to that of each of the first and second short sides SS1 and SS2.

A direction parallel to the long sides LS1 and LS2 of the display device 1 may be referred to as a lateral direction or a first direction DR1. A direction parallel to the short sides SS1 and SS2 of the display device 1 may be referred to as a vertical direction or a second direction DR2. A direction perpendicular to the long sides LS1 and LS2 and the short sides SS1 and SS2 of the display device 1 may be referred to as a forward/backward direction or a third direction DR3.

A direction in which the display panel 10 displays an image may be referred to as a forward direction F, and the opposite direction may be referred to as a rearward direction R. The first long side LS1 may be referred to as an upper side U or y. The second long side LS2 may be referred to as a lower side D. The first short side SS1 may be referred to as a left side Le or x. The second short side SS2 may be referred to as a right side Ri.

The first long side LS1, the second long side LS2, the first short side SS1, and the second short side SS2 may be collectively referred to as an edge of the display device 1. Furthermore, the points at which the first long side LS1, the second long side LS2, the first short side SS1, and the second short side SS2 meet each other may be referred to as corners.

For example, the point at which the first short side SS1 and the first long side LS1 meet each other may be referred to as a first corner C1. The point at which the first longs side LS1 and the second short side SS2 meet each other may be referred to as a second corner C2. The point at which the second short side SS2 and the second long side LS2 meet each other may be referred to as a third corner C3. The point at which the second long side LS2 and the first short side SS1 meet each other may be referred to as a fourth corner C4.

Figure 2:
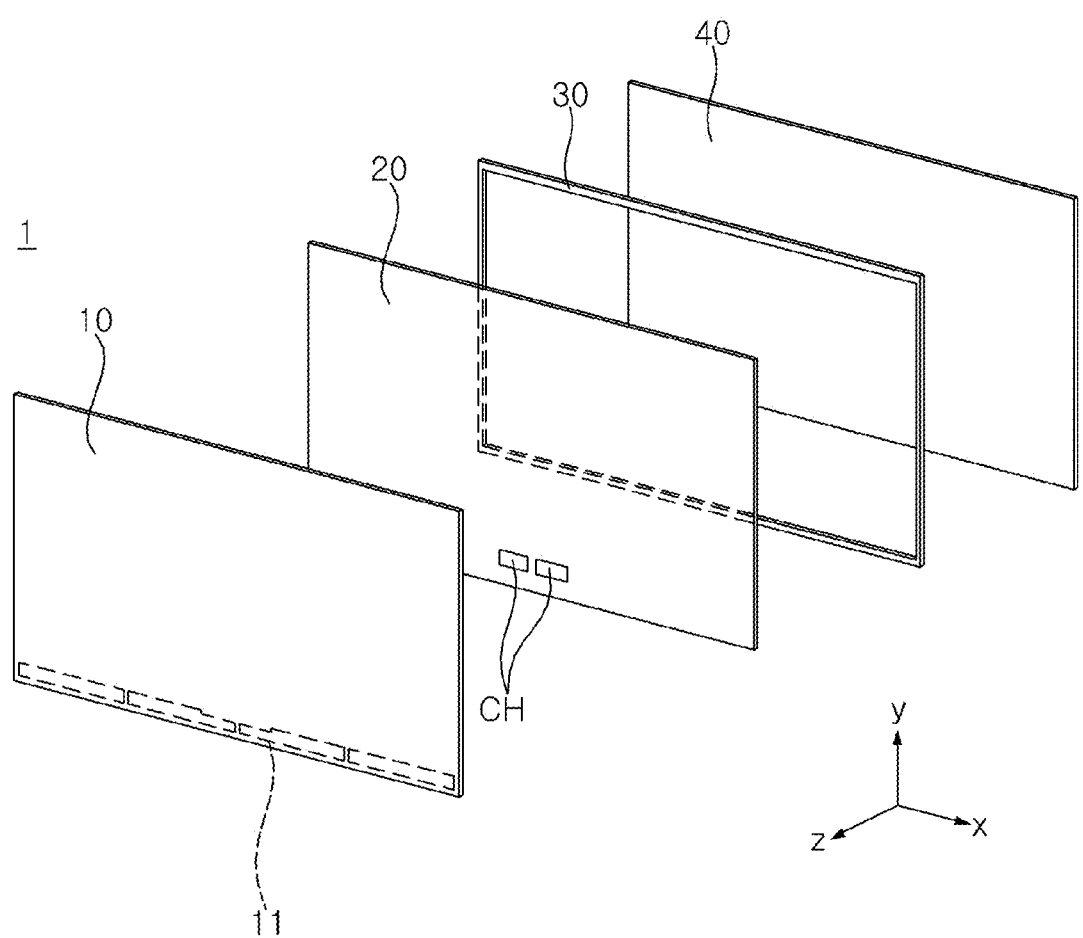

Referring to FIGS. 1 and 2, the display device 1 may include the display panel 10, a frame 20, a side frame 30, and a back cover 40.

The display panel 10 may define the front surface of the display device 1, and may display an image on the front surface of the display device 1. For example, the display panel 10 may be an OLED (Organic Light-Emitting Diode) panel. Here, a display panel applicable to the present disclosure is not limited to the OLED panel. The display panel 10 may divide an image into a plurality of pixels, and may control the color, brightness and chroma of each of the pixels, thereby outputting the image. The display panel 10 may be divided into an active area, in which an image is displayed, and an inactive area, in which an image is not displayed. The display panel 10 may generate light corresponding to red, green or blue in response to a control signal.

The frame 20 may be positioned behind the display panel 10, and the display panel 10 may be coupled to the frame 20. For example, the frame 20 may include a metal material. The frame 20 may be referred to as a main frame or a module cover.

The side frame 30 may extend along the periphery of the frame 20. The frame 20 may be coupled to the side frame 30 from the front of the side frame 30. The side frame 30 may cover the lateral side surfaces of the display panel 10 and the frame 20. Here, the side frame 30 may be referred to as a guide panel.

The back cover 40 may be positioned behind the frame 20, and may be coupled to the frame 20. For example, the back cover 40 may be injection-molded from a resin material. Alternatively, the back cover 40 may include a metal material.

Figure 3:
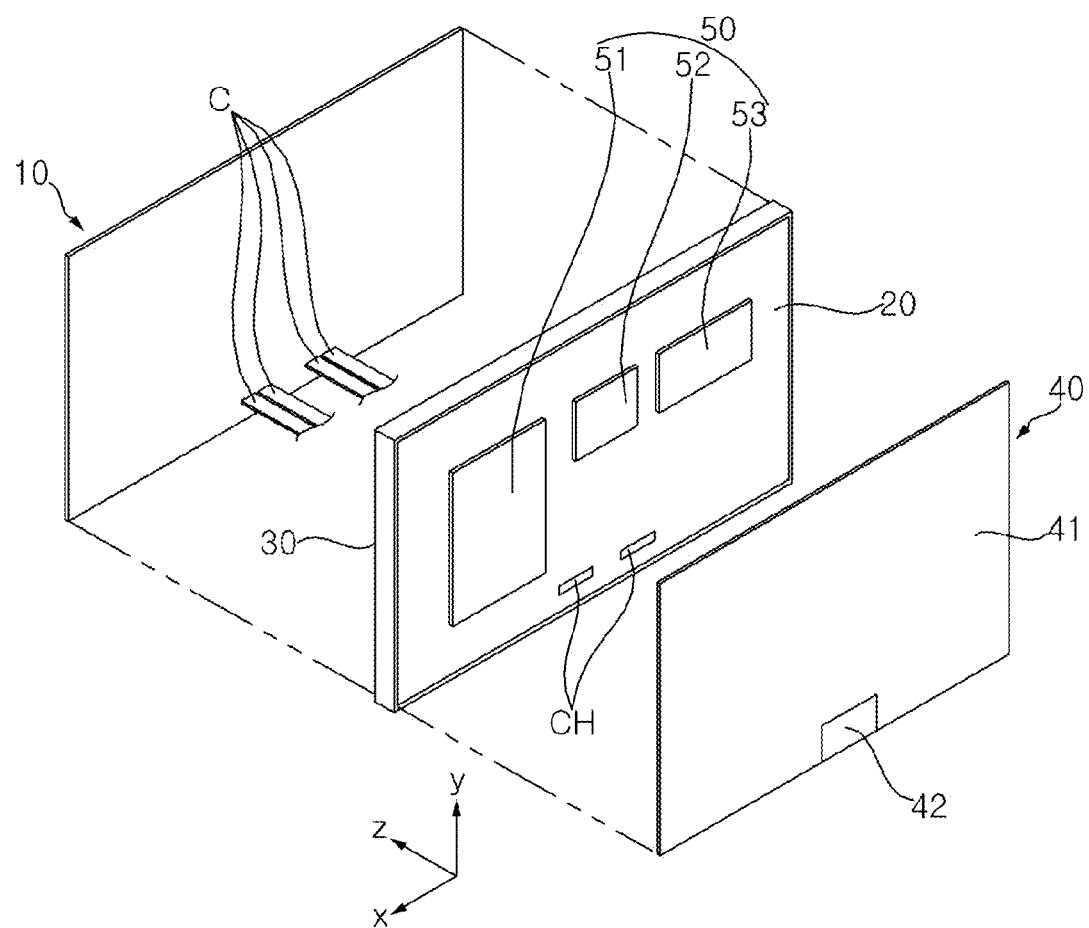

Referring to FIG. 3, boards 50 may be mounted to the frame 20 from the rear of the frame 20. A plurality of electronic elements may be mounted on the boards 50. The boards 50 may be PCBs (Printed Circuit Boards), and may be electrically connected to electronic parts of the display device.

For example, the boards 50 may include a power supply board 51 configured to supply power to the individual components of the display device, a timing controller board 52 configured to provide an image signal to the display panel 10, and a main board 53 configured to provide an image signal to the display panel 10 and/or the timing controller board 52 and to control the display device.

Meanwhile, an S-PCB 11 (Source PCB, see FIG. 2) may be adjacent to the lower side of the display panel 10, and may be coupled to the rear surface of the display panel 10. A cable C may extend through a cable hole CH formed in the lower portion of the frame 20, and may connect the S-PCB 11 to the timing controller board 52. Accordingly, the cable C may transmit digital video data and a timing control signal to the S-PCB 11 from the timing controller board 52. For example, the cable C may be an FFC (Flexible Flat Cable).

Figure 4:
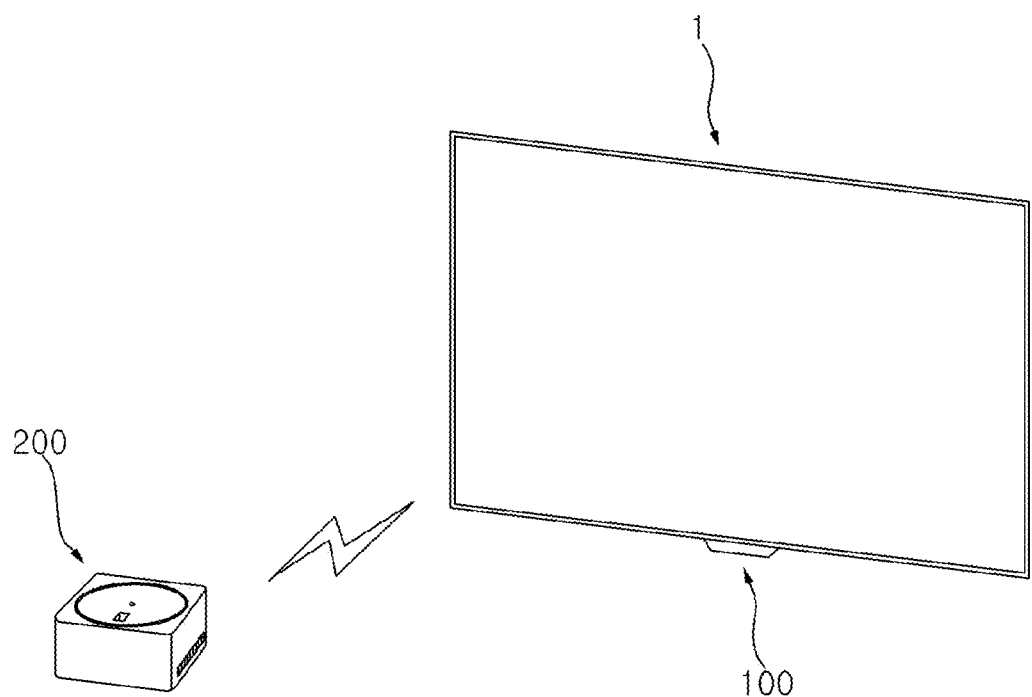

Referring to FIG. 4, a control box 200 may be spaced apart from the display device 1. The control box 200 may be referred to as a set-top box. The control box 200 may transmit and receive information to and from the display device 1 without wires. The communication module (not shown) of the control box 200 may perform wireless communication with the communication module 100 of the display device 1. At least a portion of the communication module 100 may project to the outside from the edge of the display device 1. Accordingly, the communication module 100 may perform efficient wireless communication with the communication module of the control box 200.

Stability of wireless communication between the control box 200 and the display device 1 may be dependent on the relative position between the control box 200 and the display device 1. The display device 1 may be positioned at a constant location in order to maintain a certain distance to a user. There is a need to allow the control box 200 to be freely positioned for user convenience.

Meanwhile, the control box 200 may be one component of the display device 1. In this case, the display device 1 including the display panel 10 may be referred to as a head 1.

Figure 5:
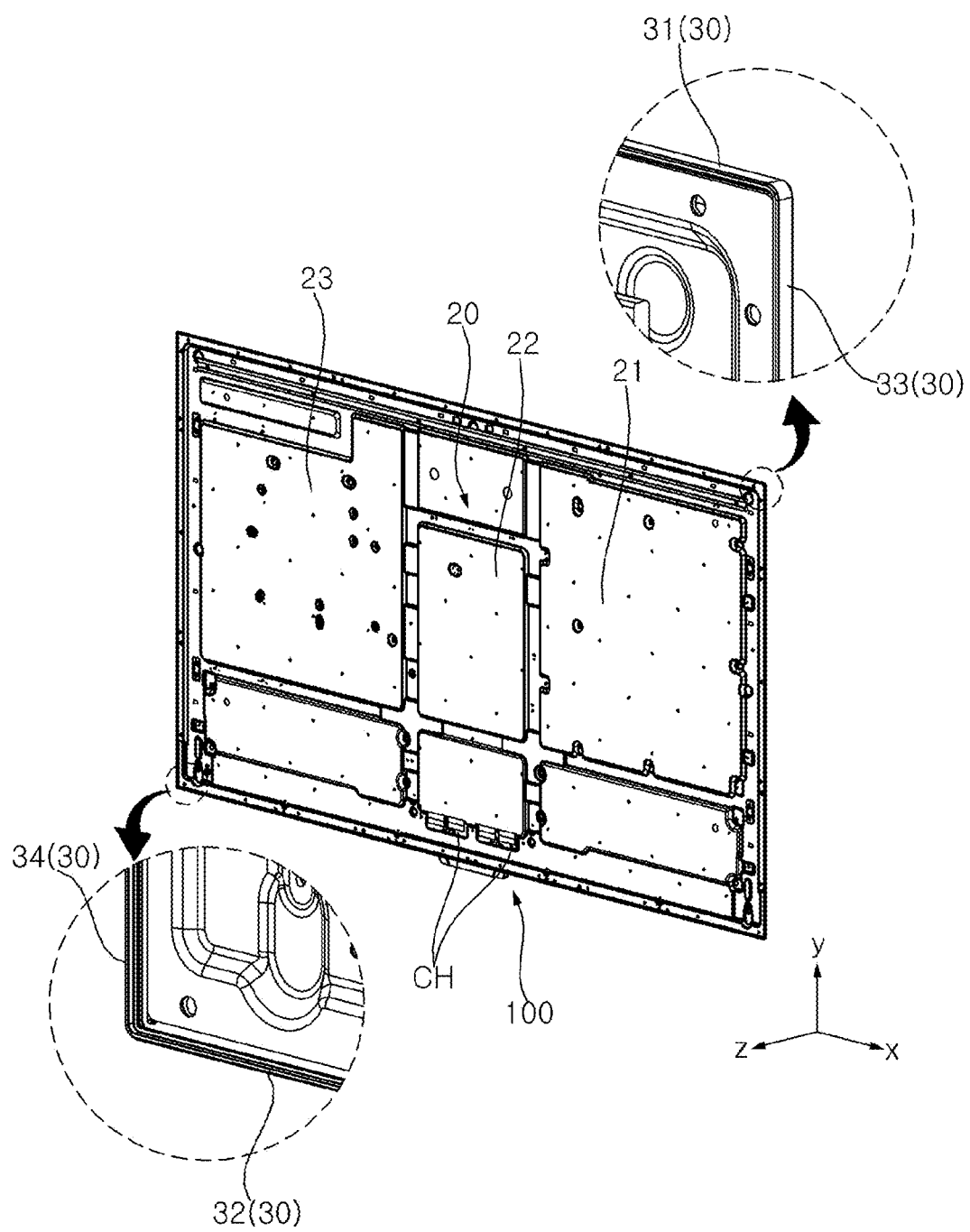

Referring to FIG. 5, the side frame 30 may include a first part 31, a second part 32, a third part 33, and a fourth part 34. The first part 31 may extend along the upper side of the frame 20, and may define the first long side LS1 (see FIG. 1). The third part 33 may be bent downwards at the right end of the first part 1 and may then extend along the right side of the frame 20, thereby defining the second short side SS2 (see FIG. 1). The second part 32 may be bent at the lower end of the third part 33 and may then extend along the lower side of the frame 20, thereby defining the second long side LS2 (see FIG. 1). The fourth part 34 may be bent upwards at the end of the second part 32 and may then extend along the left side of the frame 20, thereby defining the first short side SS1 (see FIG. 1).

A first forming portion 21, a second forming portion 22, and a third forming portion 23 may be formed by pressing the front surface of the frame 20 rearwards. The first forming portion 21 may be positioned close to the right side of the frame 20, the third forming portion 23 may be positioned close to the left side of the frame 20, and the second forming portion 22 may be positioned between the first forming portion 21 and the third forming portion 23. The power supply board 51 (see FIG. 3) may be mounted on the rear surface of the first forming portion 21. The timing controller board 52 (see FIG. 3) may be mounted on the rear surface of the second forming portion 22. The main board 53 (see FIG. 3) may be mounted on the rear surface of the third forming portion 23.

Figure 6:
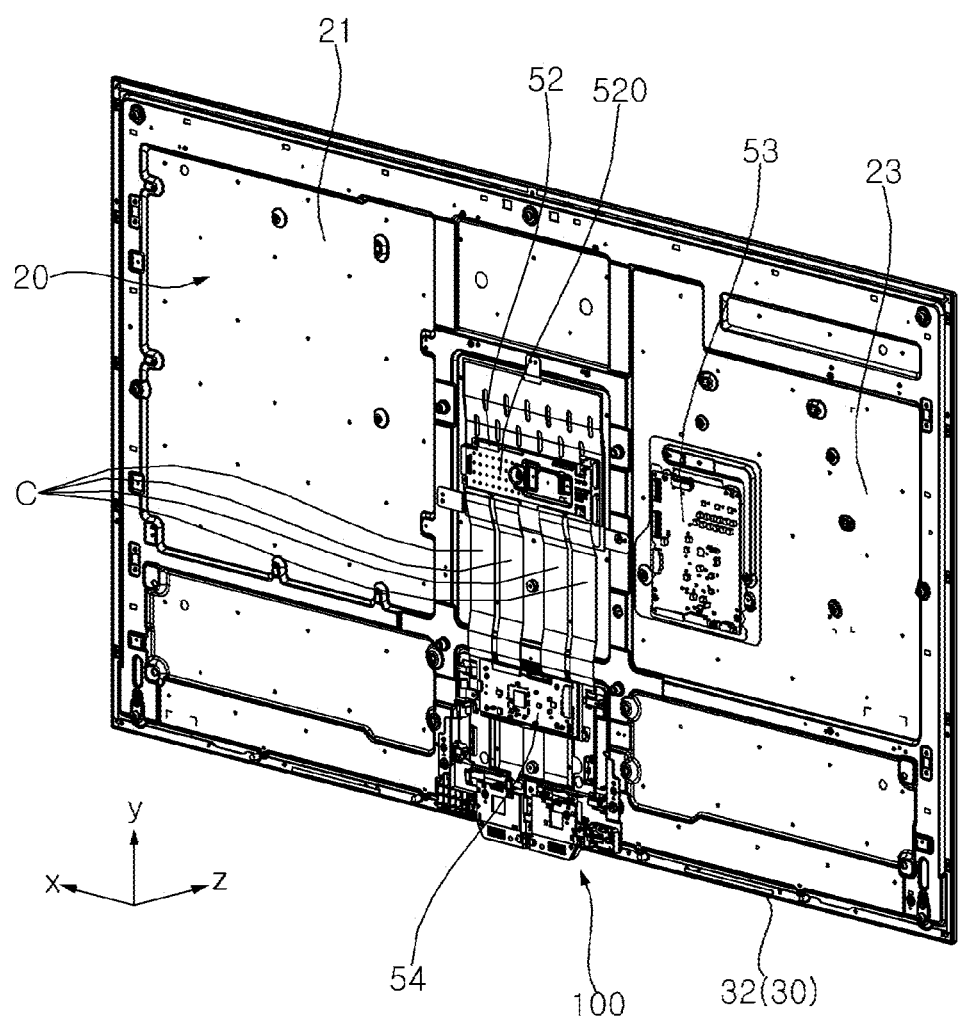

Referring to FIG. 6, a shield plate 520 may be mounted on the rear surface of the timing controller board 52. A first board 54 may be spaced apart downwards from the timing controller board 52, and may be mounted on the rear surface of the frame 20. A second board 53 may be spaced rightwards apart from the timing controller board 52, and may be mounted on the rear surface of the frame 20. The shield plate (not shown) may be mounted on the rear surfaces of the first board 54 and the second board 53. The communication module 100 may receive compressed sound and/or video data from the communication module of the control box 200 (see FIG. 4). The first board 54 may release and convert the compressed sound and/or video data received from the communication module 100 and may provide the converted data to the second board 53. The second board 53 may provide the data received from the first board 54 to the display panel 10 (see FIG. 3) through the timing controller board 52. For example, the first board 54 may be WAV (waveform audio format) board or a WAV22 board, and the second board 53 may be an AMP (amplifier) board. For example, the second board 53 may be the main board 53. The communication module 100 may be referred to as a communication unit 100 or a communication box 100.

Figure 7:
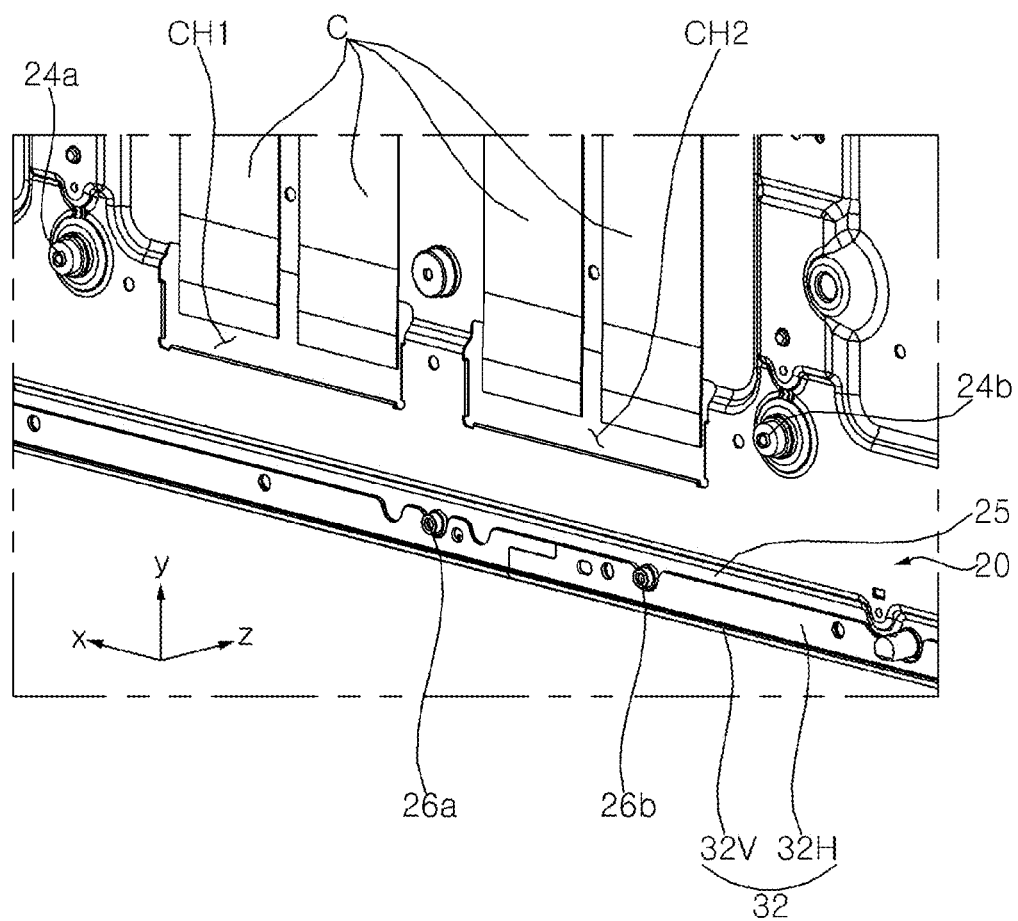

Referring to FIG. 7, a first cable hole CH1 and a second cable hole CH2 may be formed through the frame 20 in the forward/backward direction, and may be adjacent to the second part 32. The first cable hole CH1 may be close to the second cable hole CH2 but be spaced apart from the second cable hole CH2. For example, the four cables C may constitute two pairs of cables. One pair of cables may extend through the first cable hole CH1, and the other pair of cables may extend through the second cable hole CH2.

The second part 32 may include a vertical portion 32V and a horizontal portion 32H. The vertical portion 32V may extend along the lower side of the frame 20, and may define the lower side of the second part 32. The vertical portion 32V may have a width in a direction in which the vertical portion 32V intersects the frame 20. In other words, the length of the vertical portion 32V may be defined in the lateral direction, and the width of the vertical portion 32V may be defined in the forward/backward direction. The thickness of the vertical portion 32V may be defined in the vertical direction.

The horizontal portion 32H may project toward the rear of the frame 20 from the upper side of the frame 20. The horizontal portion 32H may be disposed behind the frame 20 so as to be parallel to the frame 20. In other words, the length of the horizontal portion 32H may be defined in the lateral direction, and the width of the horizontal portion 32H may be defined in the vertical direction. The thickness of the horizontal portion 32H may be defined in the forward/backward direction.

A pressed portion 25 may be formed by pressing the rear surface of the frame 20 forwards, and may define the lower side of the frame 20. The front surface of the pressed portion 25 may be in contact with the rear surface of the horizontal portion 32H. The horizontal portion 32H may be coupled or fixed to the pressed portion 25.

Lower fixing portions 26a and 26b may project toward the horizontal portion 32H from the pressed portion 25, and may extend through the horizontal portion 32H. A first lower fixing portion 26a may be spaced leftwards apart from a second lower fixing portion 26b. Upper fixing portions 24a and 24b may project rearwards from the frame 20. A first upper fixing portion 24a may be adjacent to the first cable hole CH1, and a second upper fixing portion 24b may be adjacent to the second cable hole CH2.

For example, the lower fixing portions 26a and 26b and the upper fixing portions 24a and 24b may be PEM nuts.

Figure 8:
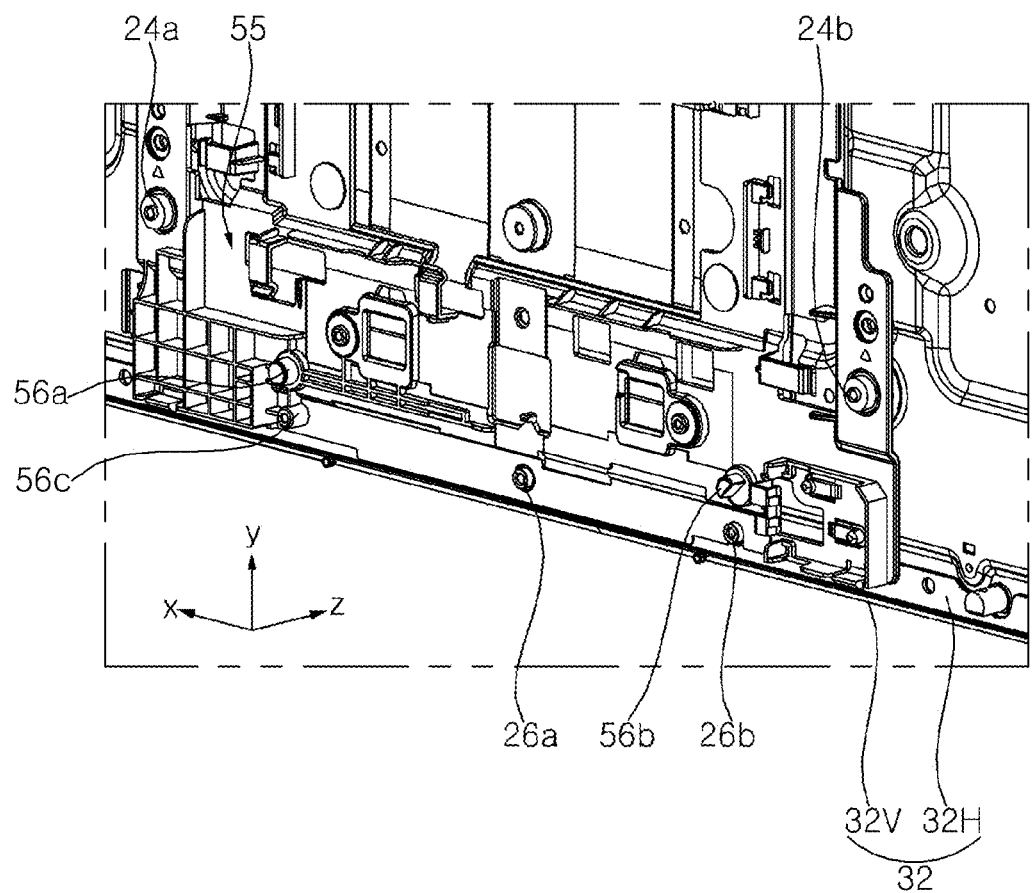

Referring to FIG. 8, a base 55 may be removably coupled to the frame 20 and the second part 32 at the rear of the frame 20. The base 55 may be positioned above the vertical portion 32V. A portion of the base 55 may cover at least a portion of the rear surface of the cable holes CH1 and CH2 (see FIG. 7). A portion of the base 55 may cover a portion of the rear surface of the horizontal portion 32H. The lower fixing portions 26a and 26b and the upper fixing portions 24a and 24b may extend through the base 55.

Bosses 56a and 56b and a third lower fixing portion 56c may project rearwards from the base 55. The third lower fixing portion 56c may be adjacent to the vertical portion 32V, and may be opposed to the horizontal portion 32H based on the base 55. The third lower fixing portion 56c may be opposed to the second lower fixing portion 26b based on the first lower fixing portion 26a. A first boss 56a may be adjacent to the third lower fixing portion 56c, and may be spaced upwards apart from the third lower fixing portion 56c. A second boss 56b may be adjacent to the second lower fixing portion 26b, and may be spaced upwards apart from the second lower fixing portion 26b. For example, the third lower fixing portion 56c may be a PEM nut. Meanwhile, bosses 56a and 56b may be referred to as fixing pins.

Figure 9:
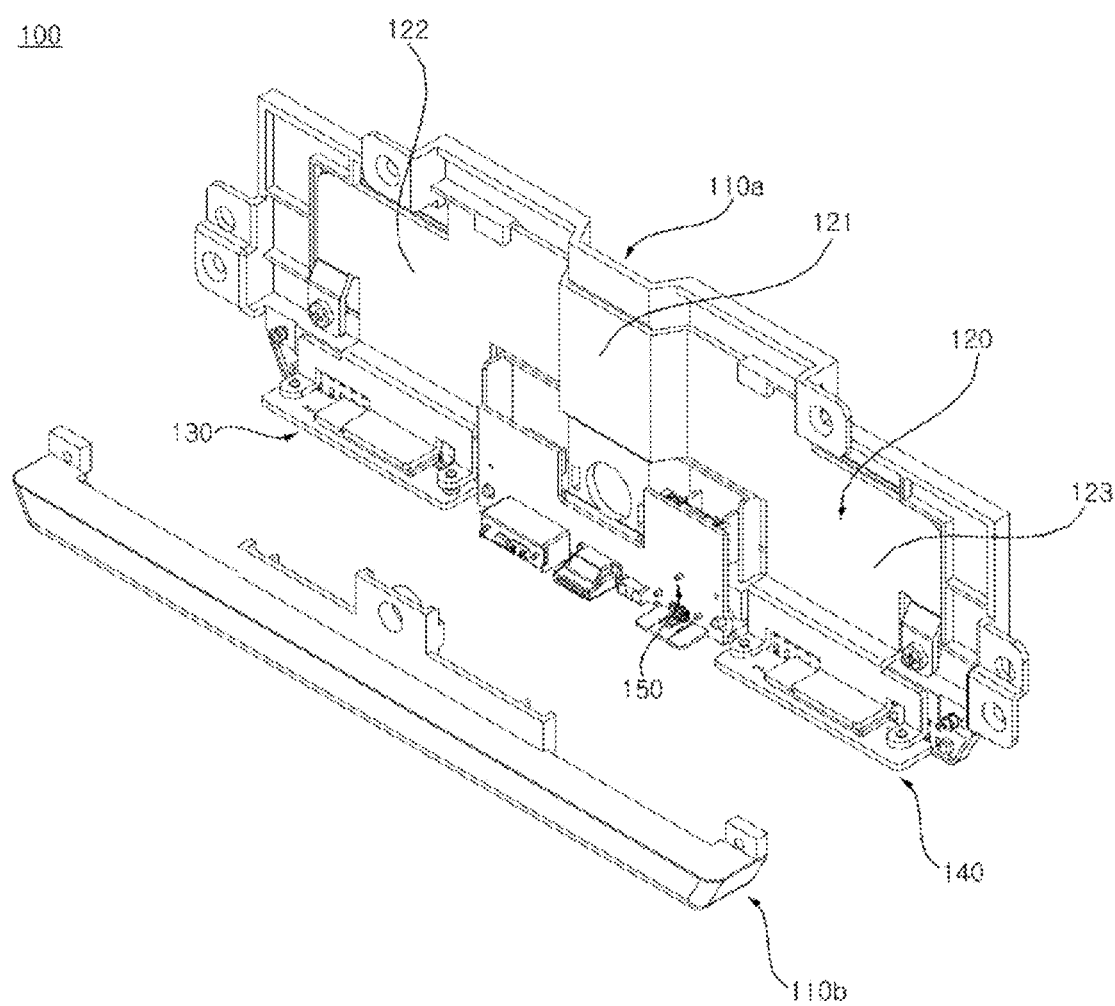

Referring to FIG. 9, the communication module 100 may include a rear cover 100a, a front cover 100b, an inner plate 120, a first antenna module 130, a second antenna module 140, and an infrared transmitting and receiving unit 150. The antenna modules 130 and 140 may be referred to as antennas 130 and 140.

The inner plate 120 may be coupled or fixed to the front surface of the rear cover 110a. For example, the rear cover 110a may be made of plastic through injection molding. The inner plate 120 may be referred to as a radiation plate 120. The inner plate 120 may include metal. For example, the inner plate 120 may include aluminum. The inner plate 120 may include a central plate 121, a first connecting plate 122, and a second connecting plate 123. The first connecting plate 122 may be opposed to the second connecting plate 123 based on the central plate 121.

The infrared transmitting and receiving unit 150 may be positioned between the first connecting plate 122 and the second connecting plate 123, and may be coupled or fixed to the rear cover 110a. The infrared transmitting and receiving unit 150 may be positioned below the central plate 121.

The first antenna 130 may be coupled or fixed to the first connecting plate 122, and the second antenna 140 may be coupled or fixed to the second connecting plate 123. For example, the first antenna 130 may be a left-side antenna, and the second antenna 140 may be a right-hand antenna.

The front cover 110b may be coupled to the rear cover 110a. The front cover 110b may cover the first antenna 130, the second antenna 140 and/or the infrared transmitting and receiving unit 150. For example, the front cover 110b may be made of plastic through injection molding.

Figure 10:
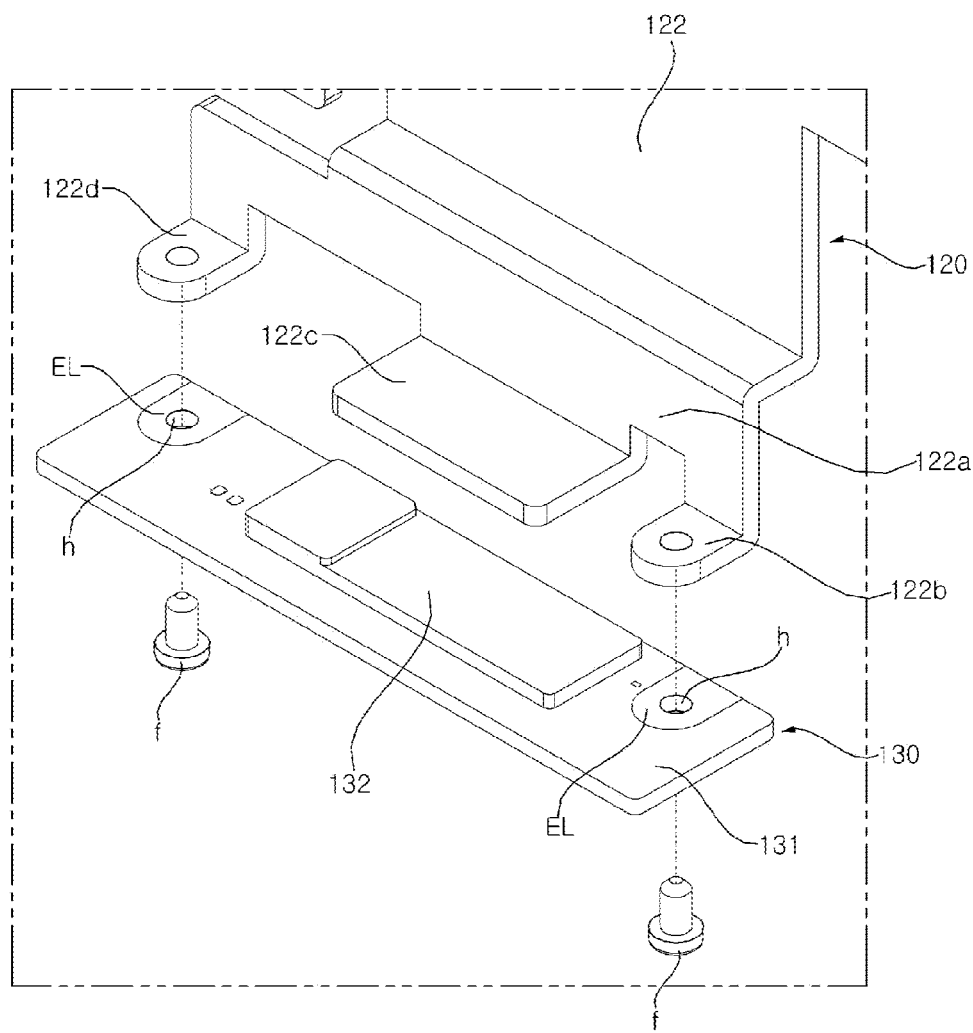

Referring to FIG. 10, the first connecting plate 122 may include a body portion 122a, a first leg 122b, and an extension plate 122c. The first leg 122b may extend from one side of the body portion 122a, and may be bent at the end thereof. The second leg 122d may extend from the other side of the body portion 122a, and may be bent at the end thereof. The extension plate 122c may be positioned between the first leg 122b and the second leg 122d, and may extend from the body portion 122a and be bent. The extension plate 122c may extend from the body portion 122a and be bent.

The first antenna module 130 may include a board 131 and a shield cover 132. The board 131 may include a front surface and a rear surface. Electronic elements may be mounted on the rear surface of the board 131. The shield cover 132 may be coupled to the rear surface of the board 131 so as to cover the electronic elements. The shield cover 132 may be a conductor. For example, the shield cover 132 may include metal. Holes H may be formed in two opposite sides of the board 131. The board 131 may be coupled to the bent ends of the first leg 122b and/or the second leg 122d by means of fastening members f.

An electrode EL may be formed on the rear surface of the board 131 so as to correspond to the first leg 122b and/or the second leg 122d. Each of the first leg 122b and/or the second leg 122d may be in contact with the electrode EL, and the electrode EL may be electrically connected to the first leg 122b and/or the second leg 122d. The legs 122b and 122d may be conductors. Current leaking from the board 131 may be grounded via the electrode EL and the legs 122b and 122d. Furthermore, the heat generated by the board 131 may be transmitted via the legs 122b and 122d.

The extension plate 122c may be bent so as to face the rear surface of the board 131, and may be in contact with the shield cover 132. The extension plate 122c may be a conductor. The heat generated by the first antenna module 130 may be transmitted via the shield cover 132 and the extension plate 122c. Furthermore, the current leaking from the first antenna module 130 may be grounded via the shield cover 132 and the extension plate 122c. The front surface of the first antenna module 130 may face downwards. The front surface and/or the rear surface of the board 131 of the first antenna module 130 may be perpendicular to the front surface of the display panel 10.

Figure 11:
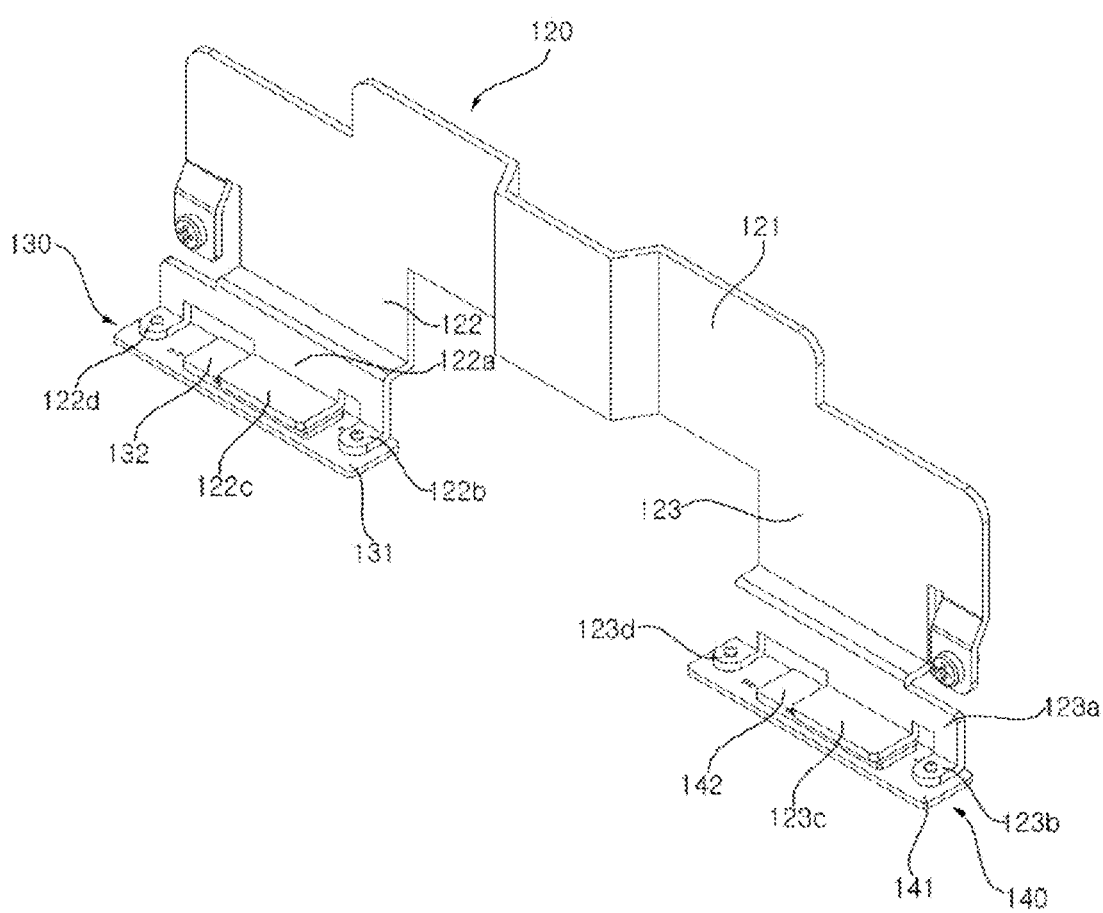

Referring to FIG. 11, the second connecting plate 123 may include a body portion 123a, a first leg 123b, a second leg 123d, and an extension plate 123c. The first leg 123b may extend from one side of the body portion 123a, and may be bent at the end thereof. The second leg 123d may extend from the other side of the body portion 123a, and may be bent at the end thereof. The extension plate 123c may be positioned between the first leg 123b and the second leg 123d, and may extend from the body portion 123a and be bent. The extension plate 123c may extend from the body portion 123a and may be bent.

The second antenna module 140 may include a board 141 and a shield cover 142. The board 141 may include a front surface and a rear surface. Electronic elements may be mounted on the rear surface of the board 141. The shield cover 142 may be coupled to the rear surface of the board 141 so as to cover the electronic elements. The shield cover 142 may be a conductor. For example, the shield cover 142 may include metal. The board 141 may be coupled to the bent ends of the first leg 123b and/or the second leg 123d by means of fastening members f.

The electrode EL (see FIG. 10) may be formed on the rear surface of the board 141 so as to correspond to the first leg 123b and/or the second leg 123d. Each of the first leg 123b and/or the second leg 123d may be in contact with the electrode EL, and the electrode EL may be electrically connected to the first leg 123b and/or the second leg 123d. The legs 123b and 123d may be conductors. The current leaking from the board 141 may be grounded via the electrode EL and the legs 123b and 123d. Furthermore, the heat generated by the board 141 may be transmitted via the legs 123b and 123d.

The extension plate 123c may be bent so as to face the rear surface of the board 141, and may be in contact with the shield cover 142. The extension plate 123c may be a conductor. The heat generated by the second antenna module 140 may be transmitted via the shield cover 142 and the extension plate 123c. Furthermore, the current leaking from the second antenna module 140 may be grounded via the shield cover 142 and the extension plate 123c. The front surface of the second antenna module 140 may face downwards. The front surface and/or the rear surface of the board 141 of the second antenna module 140 may be perpendicular to the front surface of the display panel 10.

Figure 12:
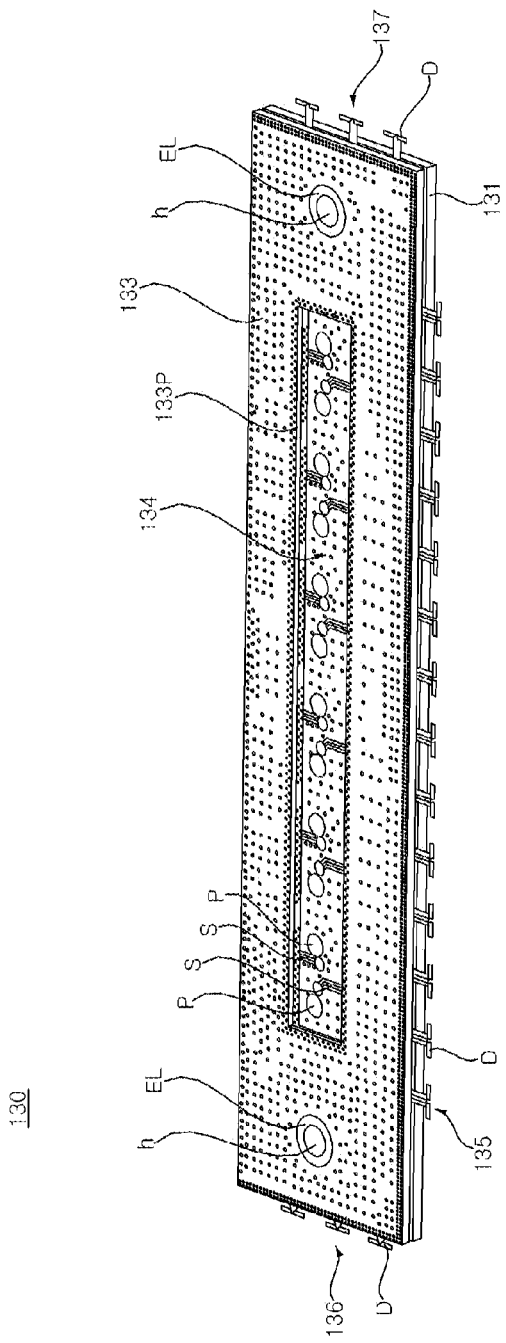

Referring to FIG. 12, the first antenna module 130 may include a board 131, a cover layer 133, a first antenna 134, a second antenna portion 134, a second antenna portion 135, a third antenna portion 136, a fourth antenna portion 137, and a fastening hole h.

The board 131 may be a rectangular PCB. The board 131 may include a front surface and a rear surface, which are opposed to each other. The length of the long side of the board 131 may be four or five times the length of the short side of the board. The cover layer 133 may cover a portion of the front surface of the board 131. The shape of the cover layer 133 may correspond to the shape of the board 131, and the cover layer 133 may have an opening 133P in the center thereof.

The first antenna portion 134 may be formed on the front surface of the board 131, and may be exposed to the outside through the opening 133P in the cover layer 133. The second antenna portion 135 may be positioned at the long side of the board 131. The third antenna portion 136 may be positioned at one short side of the board 131, and the fourth antenna portion 137 may be positioned at the other short side of the board 131. The third antenna portion 136 may be opposed to the fourth antenna portion 137 based on the first antenna portion 134.

The first antenna portion 134 may include a plurality of patches P and a plurality of power feeding portions S. Each of the patches P may be a circular electrode. The patches P may be sequentially arranged at regular intervals in the longitudinal direction of the board 131. For example, the patches P may include 12 patches. The power feeding portions S may be formed on the front surface of the board 131 adjacent to the patches P. For example, the power feeding portions S may include 12 patches. Each of the patches P may be connected to a corresponding one of the power feeding portions S. For example, the first antenna portion 134 may sense a horizontal polarization wave.

A pair power feeding portions S may be positioned between a pair of patches P. One of the pair of power feeding portions S may extend to one long side from the other long side of the cover layer 133, and may be bent adjacent to a corresponding one of the pair of patches P and be connected to the one patch P. The other of the pair of power feeding portions S may extend to the other long side from the one long side of the cover layer 133, and may be bent adjacent to the other of the pair of patches P and be connected to the other patch P.

The second antenna portion 135 may be formed along the long side of the board 131. The second antenna portion 135 may include a plurality of dipoles D. The plurality of dipoles P may be sequentially formed along the long side of the board 131. For example, the plurality of dipoles D may include 14 dipoles. For example, the second antenna portion 135 may sense a horizontal polarization wave.

The third antenna portion 136 may be formed along one short side of the board 131. The third antenna portion 136 may include a plurality of dipoles D. The plurality of dipoles D may be sequentially formed along one side of the board 131. For example, the plurality of dipoles D may include three dipoles. For example, the third antenna portion 136 may sense a horizontal polarization wave.

The fourth antenna portion 137 may be formed along the other short side of the board 131. The fourth antenna portion 137 may include a plurality of dipoles D. The plurality of dipoles D may be sequentially formed along one short side of the board 131. For example, the plurality of dipoles D may include 3 dipoles. For example, the fourth antenna portion 137 may sense a horizontal polarization wave.

The fastening hole h may be formed through the front surface and the rear surface of the board 131. A first fastening hole h may be formed between the first antenna portion 134 and the third antenna portion 136, and the second fastening hole h may be formed between the first antenna portion 134 and the fourth antenna portion 137. A ground electrode EL may be formed around the fastening hole h.

Consequently, wave-transmitting/receiving sensitivity of the first antenna module 130 may be improved.

Figure 13:
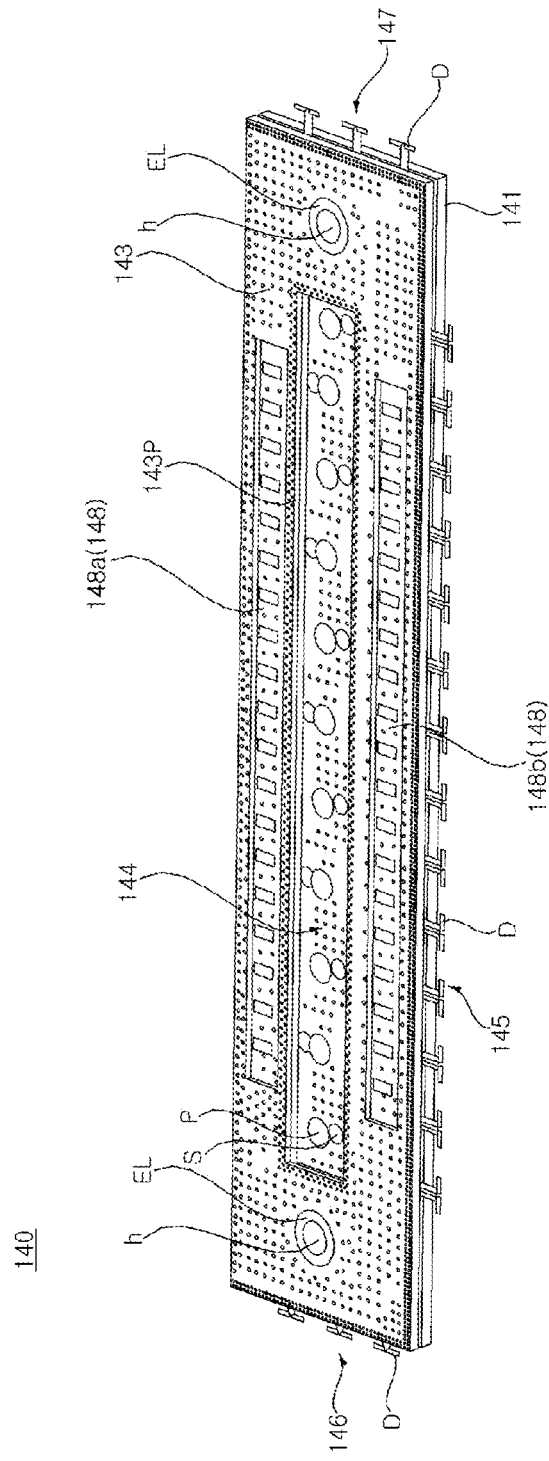

Referring to FIG. 13, the second antenna module 140 may include a board 141, a cover frame 143, a first antenna portion 144, a second antenna portion 145, a third antenna portion 146, a fourth antenna portion 147, a dummy antenna portion 148, and a fastening hole h.

The board 141 may be a rectangular PCB. The board 141 may include a front surface and a rear surface, which are opposed to each other. The length of the long side of the board 141 may be four or five times the length of the short side of the board 141. The cover frame 143 may cover a portion of the front surface of the board 141. The shape of the cover frame 143 may correspond to the shape of the board 141, and the cover frame 143 may have an opening 143P in the center thereof.

The first antenna portion 144 may be formed on the front surface of the board 141, and may be exposed to the outside through the opening 143P in the cover frame 143. The second antenna portion 145 may be positioned at the long side of the board 141. The third antenna portion 146 may be positioned at one short side of the board 141, and the fourth antenna portion 147 may be positioned at the other short side of the board 141. The third antenna portion 146 may be opposed to the fourth antenna portion 147 based on the first antenna portion 144.

The first antenna portion 144 may include a plurality of patches P and a plurality of power feeding portions S. Each of the patches P may be a circular electrode. The patches P may be sequentially arranged at regular intervals in the longitudinal direction of the board 141. For example, the patches P may include 12 patches. The power feeding portions S may be formed on the front surface of the board 141 adjacent to the patches P. For example, the power feeding portions S may include 12 patches. Each of the patches P may be connected to a corresponding one of the power feeding portions S. Each of power feeding portions S may be linearly connected to a corresponding one of the patches P from the long side of the opening 143P. Each of the power feeding portions S may be positioned between the long side of the cover frame 143 and a corresponding one of the patches P. For example, the first antenna portion 144 may sense a vertical polarization wave.

The second antenna portion 145 may be formed along the long side of the board 141. The second antenna portion 145 may include a plurality of dipoles D. The plurality of dipoles D may be sequentially formed along the long side of the board 141. For example, the plurality of dipoles D may include 14 dipoles. For example, the second antenna portions 145 may sense a horizontal polarization wave.

The third antenna portion 146 may be formed along one short side of the board 141. The third antenna portion 146 may include a plurality of dipoles D. The plurality of dipoles D may be sequentially formed along the one short side of the board 141. For example, the plurality of dipoles D may include 3 dipoles. For example, the third antenna portion 146 may sense a horizontal polarization wave.

The fourth antenna portion 147 may be formed along the other short side of the board 141. The fourth antenna portion 147 may include a plurality of dipoles D. The plurality of dipoles D may be sequentially formed along one short side of the board 141. For example, the plurality of dipoles D may include 3 dipoles. For example, the fourth antenna portion 147 may sense a horizontal polarization wave.

The dummy antenna portion 148 may be formed on the cover frame 143. The dummy antenna portion 148 may include a first dummy antenna portion 148a and a second dummy antenna portion 148b. The first dummy antenna portion 148a may be opposed to the second dummy antenna portion 148b based on the opening 143P. The dummy antenna portion 148 may include a plurality of rectangular patches or electrodes. The plurality of patches or electrodes may be sequentially arranged in the longitudinal direction of the board 141. The dummy antenna portion 148 may reduce noise.

The fastening hole h may be formed through the front surface and the rear surface of the board 141. The fastening hole h may include a plurality of fastening holes. A first fastening hole h may be formed between the first antenna portion 144 and the third antenna portion 146, and the second fastening hole h may be formed between the first antenna portion 144 and the fourth antenna portion 147. A ground electrode may be formed around the fastening hole h.

Consequently, wave-transmitting/receiving sensitivity of the first antenna module 140 may be improved.

Figure 14:
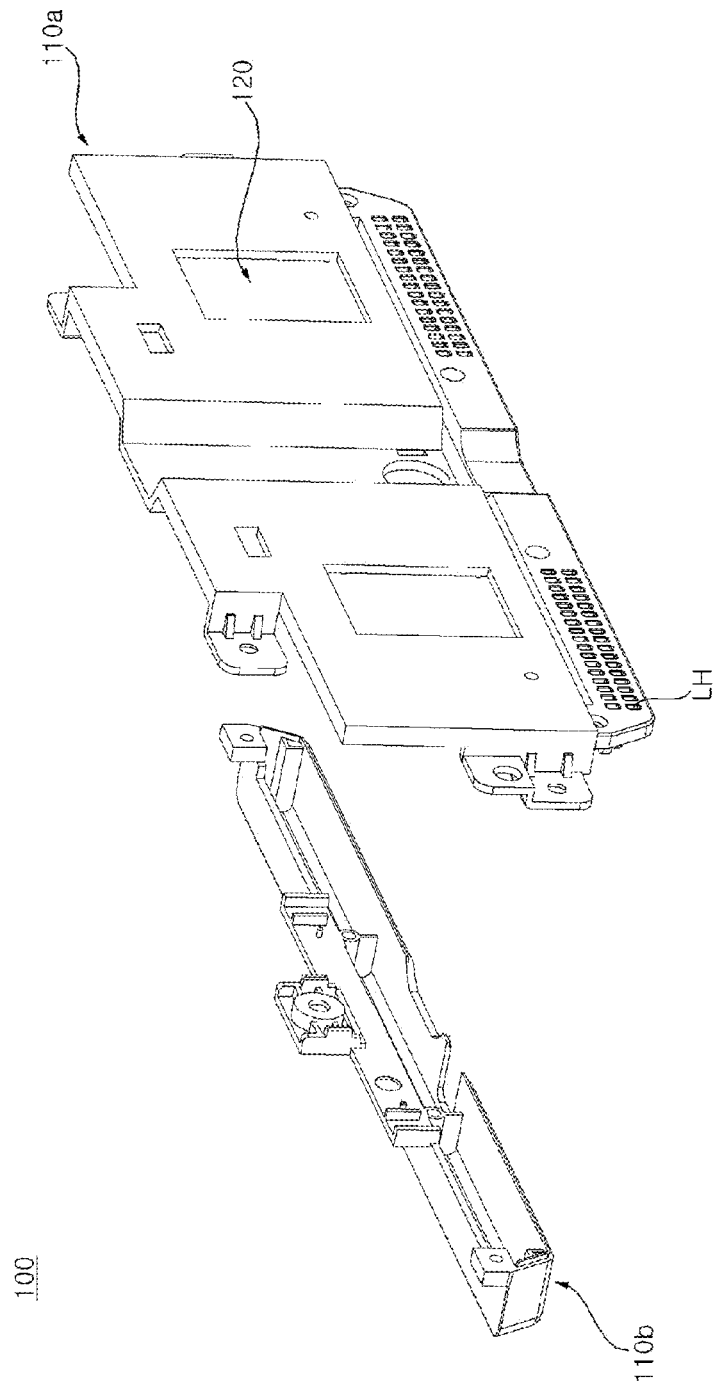
Figure 15:
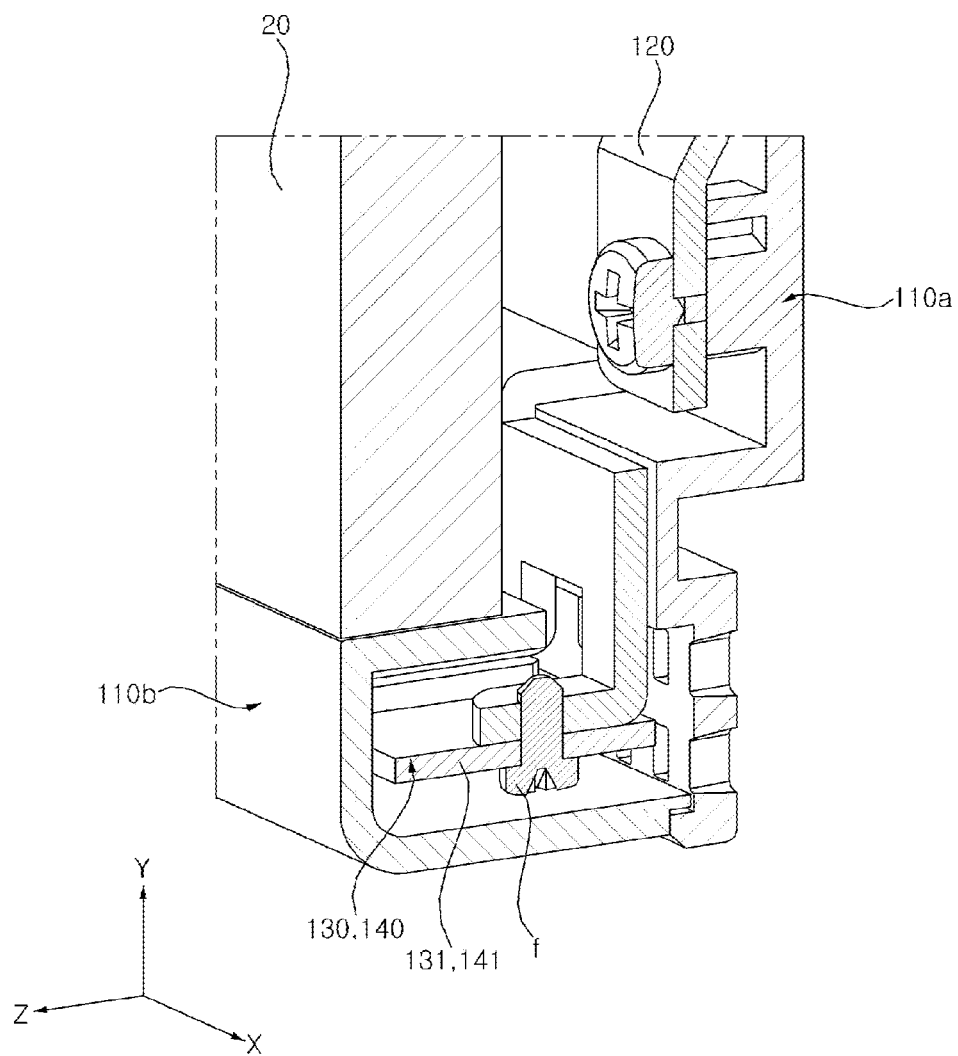

Referring to FIGS. 14 and 15 in conjunction with FIG. 8, the front cover 110b may be coupled to the rear cover 110a. The antenna modules 130 and 140 may be positioned between the front cover 110b and the rear cover 110a. The rear cover 110a may be coupled to the rear surface of the frame 20. The front cover 110b may be positioned at the lower side of the frame 20, and may cover the lower side of the frame 20 and/or the lower side of the side frame 30.

The inner plate 120 may be coupled or fixed to the rear cover 110a, and may face the rear surface of the frame 20. The rear cover 110a may have vent holes VH. The vent holes VH may be formed in the rear surface of the rear cover 110a. The vent holes VH may be positioned at the rear surface of the rear cover 110a so as to correspond to the antenna modules 130 and 140. Referring to FIG. 8, the rear cover 110a may be fixed to the lower fixing portions 26a and 26b of the frame 10 and/or the bosses 56a, 56b and 56c. The heat generated by the antenna modules 130 and 140 may be dissipated through the fastening member f and the inner plate 120. The antenna modules 130 and 140 and the inner plate 120 may be cooled through the vent holes H.

The front surfaces of the boards 131 and 141 of the antenna modules 130 and 140 may face in the downward direction of the display device 1. Accordingly, the communication between the display device 1 and the control box 200 may be efficiently performed.

Referring to FIGS. 1 to 15, the display device may include a display panel, a frame positioned behind the display panel and coupled to the display panel, and a communication box disposed adjacent one side of the frame and coupled to the frame, wherein the communication box may include an inner plate which extends in a vertical direction of the display panel, and an antenna module which defines a flat surface in a direction which intersects the vertical direction of the display panel and is fixed to the inner plate.

The inner plate may include a central plate which faces a rear surface of the frame and a connecting plate which extends toward the antenna module from the central plate, and the connecting plate may include a leg comprising a bent end and is in contact with the flat surface of the antenna module.

The antenna module may include a PCB and an electrode formed at a flat surface of the PCB, the electrode being disposed so as to face the leg of the connecting plate of the inner plate and being in contact with the leg of the connecting plate of the inner plate.

The antenna module may further include a shield cover covering a portion of the flat surface of the PCB and fixed to the PCB, and the connecting plate may further include an extension plate which extends toward the antenna module from the central plate and is in contact with the shield cover.

The communication box may include a rear case coupled to the frame and a front case coupled to the rear case and receiving and covering the antenna module, and the rear case may have at least one vent hole which faces the extension plate.

The antenna module may include a PCB, a cover frame having an opening which covers a portion of the PCB while exposing another portion of the PCB to an outside, and a first antenna portion positioned on one surface of the PCB and exposed to the outside through the opening in the cover frame, and the first antenna portion may include a plurality of patches sequentially disposed so as to be spaced apart from each other on the one surface of the PCB and a plurality of power feeding portions configured to electrically connect respective ones of the plurality of patches to the PCB.

The display device may further include a second antenna portion which is positioned at one side of the PCB and which includes a first plurality of dipoles electrically connected to the PCB.

The display device may further include a third antenna portion which is positioned at another side of the PCB and which includes a second plurality of dipoles electrically connected to the PCB, and a fourth antenna portion which is positioned at a further side of the PCB opposite the third antenna portion based on the PCB and in electrically connected to the PCB and which includes a third plurality of dipoles.

The number of the first plurality of dipoles may be greater than the number of the second plurality of dipoles or a number of the third plurality of dipoles, and the number of the second plurality of dipoles may correspond to the number of the third plurality of dipoles The number of the patches of the first antenna portion may be less than the number of the first plurality of dipoles.

The first antenna portion may sense a vertical polarization wave, and the second antenna portion may sense a horizontal polarization wave.

The first antenna portion may sense a horizontal polarization wave, and the second antenna portion may sense a horizontal polarization wave.

The antenna portion may further include a dummy antenna portion formed at the cover frame, and the dummy antenna portion may eliminate a noise signal.

The flat surface of the antenna module may define a right degree with respect to the display panel.

Certain embodiments or other embodiments of the disclosure described above are not mutually exclusive or distinct from each other. Any or all elements of the embodiments of the disclosure described above may be combined with each other in configuration or function.

For example, a configuration "A" described in one embodiment of the disclosure and the drawings and a configuration "B" described in another embodiment of the disclosure and the drawings may be combined with each other. That is, even if the combination of the configurations is not explicitly described, the combination is possible except in the case where it is stated that the combination is impossible.

Although embodiments have been described with reference to a number of illustrative embodiments thereof, it should be understood that numerous other modifications and embodiments that fall within the scope of the principles of this disclosure can be devised by those skilled in the art. More particularly, various variations and modifications are possible in the component parts and/or arrangements within the scope of the disclosure, the drawings and the appended claims. In addition to variations and modifications in the component parts and/or arrangements, alternative uses will also be apparent to those skilled in the art.

The invention claimed is:

1. A display device comprising:
   a display panel;
   a frame positioned behind the display panel and coupled to the display panel; and
   a communication box disposed adjacent one side of the frame and coupled to the frame,
   wherein the communication box comprises:
   an inner plate which extends in a vertical direction of the display panel; and
   an antenna module which defines a flat surface in a direction which intersects the vertical direction of the display panel and is fixed to the inner plate,
   wherein the inner plate comprises:
   a central plate which faces a rear surface of the frame; and
   a connecting plate which extends toward the antenna module from the central plate, and
   wherein the connecting plate comprises a leg comprising a bent end and is in contact with the flat surface of the antenna module.

2. The display device according to claim 1, wherein the antenna module comprises:
   a PCB; and
   an electrode formed at a flat surface of the PCB, the electrode being disposed so as to face the leg of the connecting plate of the inner plate and being in contact with the leg of the connecting plate of the inner plate.

3. The display device according to claim 2, wherein the antenna module further comprises a shield cover covering a portion of the flat surface of the PCB and fixed to the PCB, and
   wherein the connecting plate further comprises an extension plate which extends toward the antenna module from the central plate and is in contact with the shield cover.

4. The display device according to claim 3, wherein the communication box comprises:
   a rear case coupled to the frame; and
   a front case coupled to the rear case and receiving and covering the antenna module, and
   wherein the rear case has at least one vent hole which faces the extension plate.

5. The display device according to claim 1, wherein the antenna module comprises:
   a PCB;
   a cover frame having an opening which covers a portion of the PCB while exposing another portion of the PCB to an outside; and
   a first antenna portion positioned on one surface of the PCB and exposed to the outside through the opening in the cover frame, and
   wherein the first antenna portion comprises:
   a plurality of patches sequentially disposed so as to be spaced apart from each other on the one surface of the PCB; and
   a plurality of power feeding portions configured to electrically connect respective ones of the plurality of patches to the PCB.

6. The display device according to claim 5, further comprising a second antenna portion which is positioned at one side of the PCB and which includes a first plurality of dipoles electrically connected to the PCB.

7. The display device according to claim 6, further comprising:
   a third antenna portion which is positioned at another side of the PCB and which includes a second plurality of dipoles electrically connected to the PCB; and
   a fourth antenna portion which is positioned at a further side of the PCB opposite the third antenna portion based on the PCB and in electrically connected to the PCB and which includes a third plurality of dipoles.

8. The display device according to claim 7,
   wherein a number of the first plurality of dipoles is greater than a number of the second plurality of dipoles or a number of the third plurality of dipoles, and
   wherein the number of the second plurality of dipoles corresponds to the number of the third plurality of dipoles.

9. The display device according to claim 8, wherein a number of the plurality of patches of the first antenna portion is less than the number of the first plurality of dipoles dipoles.

10. The display device according to claim 6, wherein the first antenna portion senses a vertical polarization wave, and the second antenna portion senses a horizontal polarization wave.

11. The display device according to claim 6, wherein the first antenna portion senses a horizontal polarization wave, and the second antenna portion senses the horizontal polarization wave.

12. The display device according to claim 5, wherein the antenna module further comprises a dummy antenna portion formed at the cover frame, and
    wherein the dummy antenna portion eliminates a noise signal.

13. The display device according to claim 1, wherein the flat surface of the antenna module defines a right angle with respect to the display panel.

* * * * *